(12) United States Patent
Weintraub

(10) Patent No.: US 7,525,808 B2
(45) Date of Patent: Apr. 28, 2009

(54) DEVICE, SYSTEM, AND METHOD OF FLEXIBLE HARDWARE CONNECTIVITY

(75) Inventor: Reuven Weintraub, Ein Ayyala (IL)

(73) Assignee: Gidel Ltd., Or-Akiva (IL)

( * ) Notice: Subject to any disclaimer, the term of this patent is extended or adjusted under 35 U.S.C. 154(b) by 0 days.

(21) Appl. No.: 12/018,241

(22) Filed: Jan. 23, 2008

(65) Prior Publication Data

US 2008/0176420 A1    Jul. 24, 2008

Related U.S. Application Data

(60) Provisional application No. 60/897,050, filed on Jan. 24, 2007.

(51) Int. Cl.
*H05K 1/00* (2006.01)

(52) U.S. Cl. .......... 361/749; 361/683; 361/685; 361/686; 361/736

(58) Field of Classification Search .......... 361/749, 361/683, 685, 686, 736
See application file for complete search history.

(56) References Cited

U.S. PATENT DOCUMENTS

| | | | | |
|---|---|---|---|---|
| 4,321,654 A | * | 3/1982 | Nakajo et al. ........ | 361/744 |
| 4,436,968 A | * | 3/1984 | Giulie ................ | 200/5 R |
| 5,093,985 A | * | 3/1992 | Houldsworth et al. .... | 29/830 |
| 5,627,842 A | * | 5/1997 | Brown et al. ........... | 714/727 |
| 5,723,906 A | * | 3/1998 | Rush .................. | 257/723 |
| 6,038,048 A | * | 3/2000 | Harris et al. .......... | 398/156 |
| 6,341,068 B1 | * | 1/2002 | Bradley et al. ......... | 361/736 |
| 6,629,181 B1 | * | 9/2003 | Alappat et al. ......... | 710/300 |
| 6,672,878 B2 | * | 1/2004 | Dean .................. | 439/67 |
| 6,964,574 B2 | * | 11/2005 | Pavesi et al. .......... | 439/76.1 |
| 7,039,299 B2 | * | 5/2006 | Onodera ............... | 386/125 |
| 7,307,293 B2 | * | 12/2007 | Fjelstad et al. ........ | 257/200 |
| 2003/0151891 A1 | * | 8/2003 | Paul .................. | 361/686 |

\* cited by examiner

*Primary Examiner*—Tuan T Dinh
*Assistant Examiner*—Xiaoliang Chen
(74) *Attorney, Agent, or Firm*—Leason Ellis LLP

(57) ABSTRACT

Device, system, and method of flexible hardware connectivity. For example, a Printed Circuit Board (PCB) system includes: a rigid platform having embedded therein at least one programmable logic device; at least one rigid panel having embedded therein a set of connectors; and a flexible connection to flexibly connect, at a non-straight angel, the programmable logic device to the rigid panel along a folding axis of the rigid panel and the rigid platform, wherein a density of wires of the flexible connection is greater than a density of wires entering at least one of the connectors.

23 Claims, 5 Drawing Sheets

DEVICE, SYSTEM, AND METHOD OF FLEXIBLE HARDWARE CONNECTIVITY

PRIOR APPLICATION DATA

The present application claims priority and benefit from United States Provisional Patent Application No. 60/897,050, titled "Device, System and Method of Flexible Connectivity", filed on Jan. 24, 2007, which is hereby incorporated by reference in its entirety.

FIELD

Some embodiments of the invention are related to the field of Field Programmable Gate Arrays (FPGAs) connectivity.

BACKGROUND

A backplane may include multiple Field Programmable Gate Arrays (FPGAs), for example, soldered into rigid boards.

Unfortunately, a significant amount of logical components and electronics included on the rigid boards may require a complex connectivity, physical proximity of the rigid boards and a highly branched wiring.

SUMMARY

Some embodiments of the invention include, for example, devices, systems, and methods of flexible hardware connectivity.

In some embodiments, a Printed Circuit Board (PCB) system includes: a rigid platform having embedded therein at least one programmable logic device; at least one rigid panel having embedded therein a set of connectors; and a flexible connection to flexibly connect, at a non-straight angel, the programmable logic device to the rigid panel along a folding axis of the rigid panel and the rigid platform, wherein a density of wires of the flexible connection is greater than a density of wires entering at least one of the connectors.

In some embodiments, substantially each connector includes a mechanism to transform a plurality of wires of the flexible connection into a socket connection.

In some embodiments, the rigid panel is connected through the flexible connection with the rigid platform at an angle of approximately 90 degrees.

In some embodiments, the rigid panel is connected through the flexible connection with the rigid platform at an angle generally different from 90 degrees.

In some embodiments, the flexible connection includes at least a number of wires sufficient to logically connect the programmable logic device to the set of connectors.

In some embodiments, the PCB system includes: a flexible bridge to directly interconnect between the set of connectors and another set of connectors associated with one or more programmable logic devices external to the rigid platform.

In some embodiments, the flexible connection includes at least 600 wires per programmable logic device.

In some embodiments, at least one of the one or more programmable logic devices includes a Field Programmable Gate Array (FPGA).

In some embodiments, the PCB system includes: another rigid panel having embedded therein another set of connectors; and another flexible connection to flexibly connect, at a non-straight angel, the programmable logic device to the rigid panel along a folding axis of the rigid panel and the rigid platform.

In some embodiments, the PCB system includes at least one more programmable logic device embedded in the rigid platform.

In some embodiments, at least two of the programmable logic devices embedded in the rigid platform are interconnected.

In some embodiments, at least two of the programmable logic devices embedded in the rigid platform are interconnected using an interconnection including between 199 and 401 wires.

In some embodiments, one or more connectors of the set of connectors are directly connected to a component of a first of the programmable logic devices, and one or more other connectors of the set of connectors are directly connected to a component of a second of the programmable logic devices.

In some embodiments, the flexible connection includes: at least one set of two differential wires capable of operating in transmission-only mode; and at least one other set of two differential wires capable of operating in reception-only mode.

In some embodiments, at least one of the connectors includes a non-right-angle connector.

In some embodiments, a system for Printed Circuit Board (PCB) units includes: a rack capable of storing a set of PCB units, the rack including: a set of cavities to store the set of PCB units, and one or more PCB unit insertion mechanisms; wherein each PCB unit includes: a rigid platform having embedded therein at least one programmable logic device; at least one rigid panel having embedded therein a set of connectors; and a flexible connection to flexibly connect, at a non-straight angel, the programmable logic device to the rigid panel along a folding axis of the rigid panel and the rigid platform, wherein a density of wires of the flexible connection is greater than a density of wires entering at least one of the connectors.

In some embodiments, at least one of the insertion mechanisms includes a slide-in/slide-out mechanism.

In some embodiments, at least one of the insertion mechanisms includes one or more rails.

In some embodiments, at least one of the insertion mechanisms includes one or more slots, and a PCB unit is insertable into the one or more slots.

In some embodiments, rack includes a housing which includes: a first horizontal surface; a second horizontal surface generally parallel to the first horizontal surface; a first vertical surface; and a second vertical surface generally parallel to the first vertical surface; the rigid panel is at an angle of approximately 90 degrees with the first horizontal surface, and the rigid panel is at an angle of approximately 90 degrees with the first vertical surface.

In some embodiments, the system includes: another rack capable of storing another set of PCB units, and the racks are interconnected using one or more flexible connections.

In some embodiments, the system includes: a flexible connection capable of physically connecting between: a programmable logic device of any of the PCB units of a first rack of the racks, and a programmable logic device of any one of the PCB units of a second rack of the racks.

Some embodiments of the invention may provide other and/or additional benefits and/or advantages.

BRIEF DESCRIPTION OF THE DRAWINGS

For simplicity and clarity of illustration, elements shown in the figures have not necessarily been drawn to scale. For example, the dimensions of some of the elements may be exaggerated relative to other elements for clarity of presentation. Furthermore, reference numerals may be repeated among the figures to indicate corresponding or analogous elements. The figures are listed below.

DETAILED DESCRIPTION

In the following detailed description, numerous specific details are set forth in order to provide a thorough understanding of some embodiments of the invention. However, it will be understood by persons of ordinary skill in the art that embodiments of the invention may be practiced without these specific details. In other instances, well-known methods, procedures, components, units and/or circuits have not been described in detail so as not to obscure the discussion.

The terms "Field-Programmable Gate Array" (FPGA) or FPGA unit as used herein includes, for example, a semiconductor device containing programmable logic components (e.g., logic blocks, logic gates, memory blocks, or the like) and programmable interconnects.

The term "FPGA unit" as used herein includes, for example, a single FPGA, a pair of two interconnected FPGAs, a set of multiple interconnected FPGAs, or the like. In some embodiments, the terms "FPGA" or "FPGA unit" may optionally include non-FPGA components, for example, a logic device, a programmable logic device, a connectivity device, or the like.

Although portions of the discussion herein relate, for demonstrative purposes, to a rigid board having FPGAs or to FPGA units, embodiments of the invention are not limited in this regard and may be used, for example, in conjunction with other logic devices, programmbale logic devices, PHY devices (for example, Ethernet PHY devices, display or imaging devices), non-programmable logic devices, dedicated logic devices, connectivity devices, or a combination thereof.

Although portions of the discussion herein relate, for demonstrative purposes, to a rigid board having two FPGAs or two FPGA units, embodiments of the invention are not limited in this regard and may be used, for example, in conjunction with rigid boards having a single FPGA or a single FPGA unit, rigid boards having three FPGAs or FPGA units, or four (or other numbers of) FPGAs or FPGA units. In some embodiments, two or more of the FPGAs (or FPGA units) located on a common rigid board may be interconnected using one or more connections or wires (or groups of connections or wires), may share one or more connections or wires (or groups of connections or wires), or the like. In some embodiments, various rigid boards or "trays" may include different numbers of FPGAs and/or other programmable logic devices.

Figure 1:
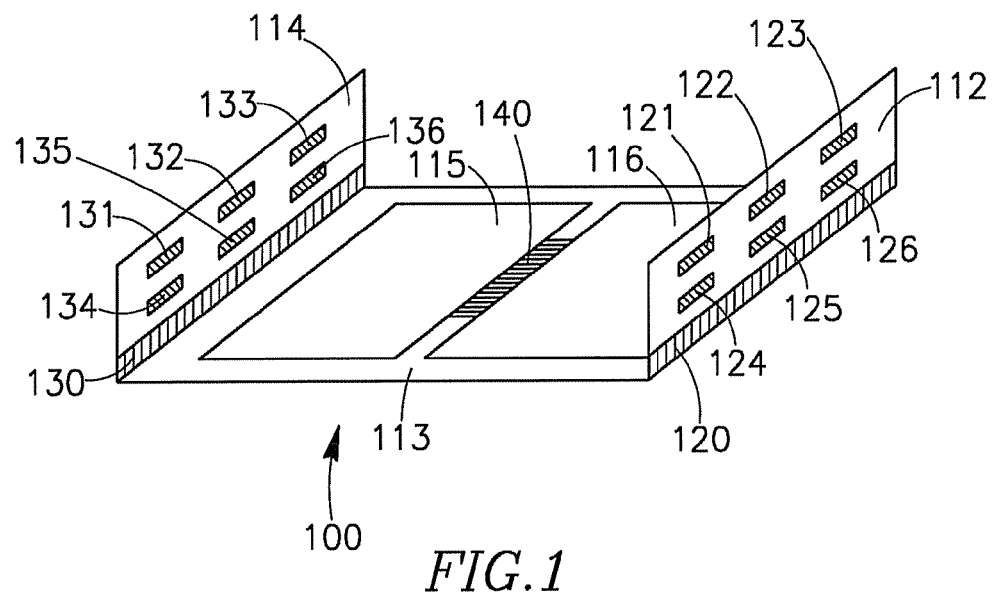
FIG. 1 is a schematic illustration of a Field Programmable Gate Array (FPGA) tray, in accordance with some demonstrative embodiments of the invention.

FIG. 1 schematically illustrates a FPGA tray 100 in accordance with some demonstrative embodiments of the invention. In some embodiments, tray 100 may include two FPGA units, for example, unit 115 and unit 116. FPGA units 115-116 may be soldered together or otherwise connected onto a single platform or rigid board 113, or may be included in a single housing. In some embodiments, FPGA units 115-116 may include electronics, electronic units and/or logical units, for example, memory blocks, chips, processors, resistors, circuits, logic blocks, logic gates, or the like. FPGA units 115-116 may be interconnected using one or more connections 140.

Wire ensembles (or other suitable flexible connectivity members) 120 and 130 may connect between FPGA units 115 and 116, and connectors 121-126 and 131-136. In some embodiments, for example, wire ensemble 120 may be associated with unit 115, and may be located on a side of rigid board 113; Wire ensemble 130 may be associated with unit 116, and may be located on an opposite side of rigid board 113. In other embodiments, for example, a first portion of wire ensemble 120 may be associated with components of FPGA unit 115, whereas a second portion of wire ensemble may be associated with components of FPGA unit 116. Similarly, a first portion of wire ensemble 130 may be associated with components of FPGA unit 115, whereas a second portion of wire ensemble 130 may be associated with components of FPGA unit 116.

Wire ensembles 120 and 130 include multiple wires, cables, links, conductive materials, or the like. In some embodiments, for example, wire ensembles 120 and 130 may include approximately 720 wires, approximately, 710 wires, approximately 700 wires, approximately 730 wires, approximately 740 wires, between 710 and 730 wires, between 700 and 740 wires, or the like. Additionally, wire ensembles 120 and 130 may be flexible, as to allow decks or panels 112 and 114, respectively, to form multiple angles with rigid board 113 or to form a three dimensional structure including rigid board 113 and panels 112 and 114, e.g., a U shaped structure. In some embodiments, for example, panels 112 and 114 may form an angle of approximately 90 degrees with rigid board 113. In other embodiments, other suitable angles may be formed. Although portions of the discussion herein relate, for demonstrative purposes, to wire ensembles 120 and 130 having approximately 720 wires, embodiments of the invention may utilize other number of wires, for example, approximately 250 wires, approximately 1,000 wires (e.g., utilizing three FPGAs per rigid board), approximately 2,000 wires (e.g., utilizing three FPGAs per rigid board having substantially all connections on one side), hundreds or thousands or wires, or the like.

Wire ensemble 120 transfers data from FPGA units 115-116 to connectors 121-126, and vice-versa. For example, a first portion of wires of wire ensemble 120 may be associated with a first component of unit 116 and connected to a first connector, for example, connector 121; a second portion of wires of wire ensemble 120, possibly associated with a second component of FPGA unit 116, or a component of FPGA unit 115, may be connected to a second connector, for example, connector 123. Similarly, a first portion of wires of wire ensemble 130 may be associated with a first component of FPGA unit 115 and connected to a first connector, for example, connector 132; a second portion of wires of wire ensemble 130, possibly associated with a second component of FPGA unit 115, or a component of FPGA unit 116, may be connected to a second connector, for example, connector 123. Connectors 121-126 and/or 131-136 may include an inner wiring mechanism, transforming multiple wires of wire ensembles 120 and/or 130 associated therewith to a single connection. For example, connector 121 may be associated with multiple wires of wire ensemble 120, and when externally connected to another connector using a bridge, as described herein, the bridge is implemented as a single wire or a single wire unit.

Although portions of the discussion herein relate, for demonstrative purposes, to flexible wire ensembles 120 and 130, embodiments of the invention are not limited in this regard and may be used, for example, in conjunction with non-flexible wire ensembles 120 or 130, e.g., allowing the panel 112 to be rigidly or semi-rigidly connected to rigid board 113, and/or allowing the panel 114 to be rigidly or semi-rigidly connected to rigid board 113, optionally at a right angle of 90 degrees or other suitable (e.g., constant) angles.

Figure 2:
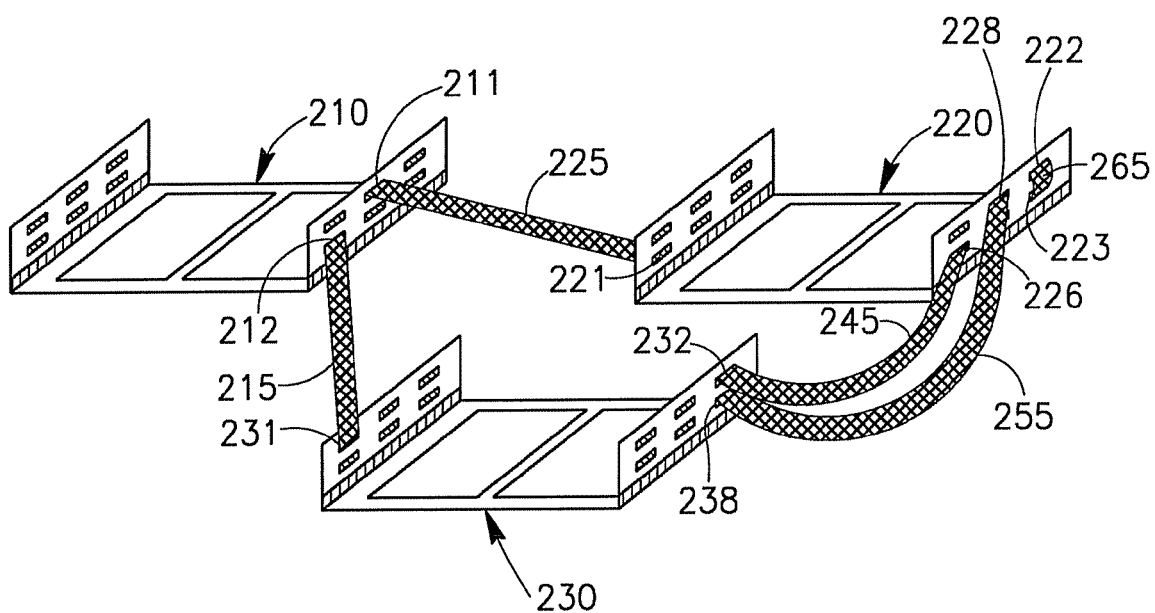
FIG. 2 is a schematic illustration of three interconnected FPGA trays, in accordance with some demonstrative embodiments of the invention.

FIG. 2 schematically illustrates three interconnected trays 210, 220 and 230, in accordance with some demonstrative embodiments of the invention. Each one of trays 210, 220 and 230 may be similar to tray 100 of FIG. 1. Some embodiments may allow interconnecting multiple trays, including, for example, physically remote trays. For example, a first connector 212 associated with tray 210 is connected to a connector 231 associated with tray 230, using a bridge 215. A second connector 211 associated with tray 210 is connected to connector 221 associated with tray 220, using bridge 225. Similarly, trays 220 and 230 are connected using bridges 245 and 255. Bridge 255 interconnects connectors 228 and 238 associated with trays 220 and 230, respectively. Bridge 245 interconnects connectors 226 and 232 associated with trays 220 and 230, respectively. A bridge 265 connects connectors 222 and 223, both located on tray 220, thereby connecting externally multiple components of tray 220. Trays 210, 220, 230 and/or additional trays may be located one on top of another, besides one another, physically remote one from the other, oriented sideways relative to one another, in a diagonal structure, in a three-dimensional structure, embedded or housed in a common housing or rack or backplane, or in multiple housings or racks or backplanes, or a combination thereof, or the like. Multiple other connections between two connectors may be applied using additional bridges, for example, allowing direct physical and/or logical connectivity (and optionally utilizing indirect physical connectivity) between substantially every pair of connectors, associated with random components of random trays. Bridges 215, 225, 245, 255, and/or 265 may transfer data or information including high frequency signals, and may be flexible.

Figure 3:
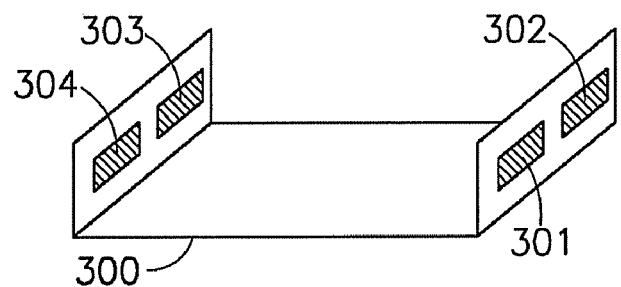
FIG. 3 is a schematic illustration of a rigid board with electronics and side connectors, in accordance with some demonstrative embodiments of the invention.

FIG. 3 schematically illustrates a rigid board with electronic components and side connectors, in accordance with some demonstrative embodiments of the invention. In some embodiments, multiple systems, such as IC or System on Chip (SoC) or ASIC Verification or Prototyping, combine a significant number of logic and electronic components with a significant number of unpredictable high-speed connection lines to interconnect multiple parts of the logic and electronic components. Accordingly, in some embodiments, a system may include multiple rigid boards to house the multiple logic and electronic components. Some embodiments may include a significant number of logic and electronic components, as well as high flexibility for huge and unpredictable I/Os density with high-speed performance. In some embodiments, a rigid board including the electronic components and multiple I/O connectors may be located on multiple axes.

For example, a rigid board 300 housing electrical components and side connectors 301-304 form an angle of approximately 90 degrees. In other embodiments, other angles may be formed, for example, approximately 83 degrees, approximately 104 degrees, approximately 35 degrees, approximately 56 degrees, approximately 120 degrees, approximately 127 degrees, or the like.

Figure 4:
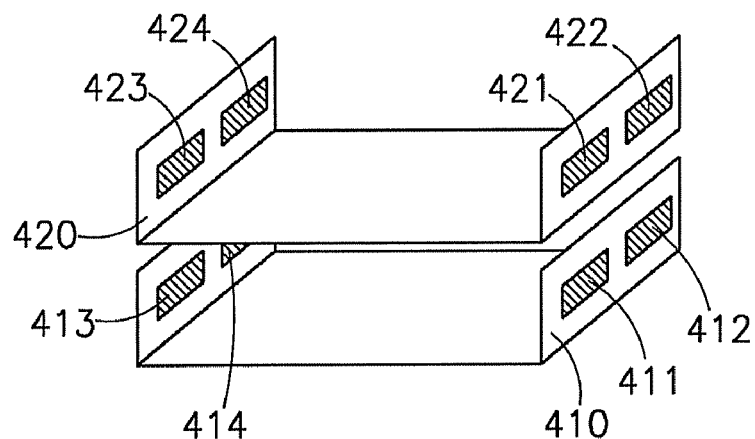
FIG. 4 is a schematic illustration of multiple rigid boards, in accordance with some demonstrative embodiments of the invention.

FIG. 4 schematically illustrates multiple rigid boards, in accordance with some demonstrative embodiments of the invention. In some embodiments, connectors may be placed generally along sides of the rigid board, for example, to increase the number of possible I/Os associated with a rigid board. For example, rigid board 410 has connections in two sides, connectors 411 and 412 on a first side, and connectors 413 and 414 on a second, generally opposite side. Similarly, rigid board 420 has connections in two sides, connectors 421 and 422 on a first side, and connectors 423 and 424 on a second, generally opposite side. For example, rigid boards 410 and 420, and possibly similar rigid boards may be located next to one another. Architecture of the rigid boards allows a three-dimensional electronics location, and multiple rigid boards are possibly externally connected. Additionally, this architecture may allow full air flow that may be needed in order to cool the electronics.

Figure 5:
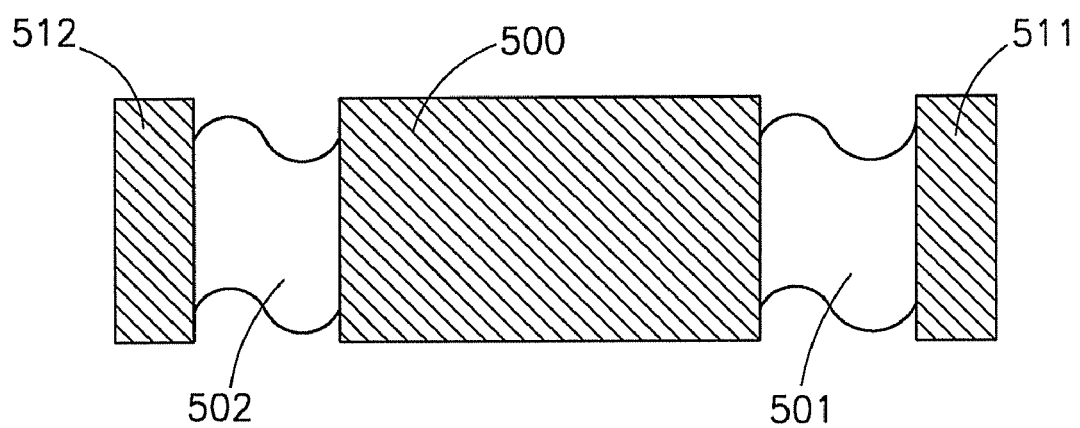
FIG. 5 is a schematic illustration of a rigid board with electronics and a rigid-flex Printed Circuit Board (PCB), in accordance with some demonstrative embodiments of the invention.

FIG. 5 schematically illustrates a rigid board with electronics and a flex-rigid Printed Circuit Board (PCB), in accordance with some embodiments of the invention. In some embodiments, a first area including electronic components and a second area including connectors may be physically separated, for example, for routing purposes. For example, rigid board 500 may include electronic components and logic components, and may be connected to rigid connectors 511 and 512, via flexible connections 501 and 502, respectively. Flexible connections 501 and 502 may include multiple inner wires, for example, approximately 118 or 120 wires, approximately 110 wires, approximately 130 wires, between 110 and 130 wires, or other suitable number of wires (for example, groups of approximately 10 wires, 120 wires, 180 wires, 240 wires, 300 wires, hundreds or thousands of wires, or the like), coated with a uniform coat. This may allow, for example, forming an angle between the rigid board and the connectors, as described herein. Additionally, some embodiments may allow adding electronics in multiple portions, for example, in connectors 511 and 512, as well as in connectors included in electronics of rigid board 500.

Figure 6:
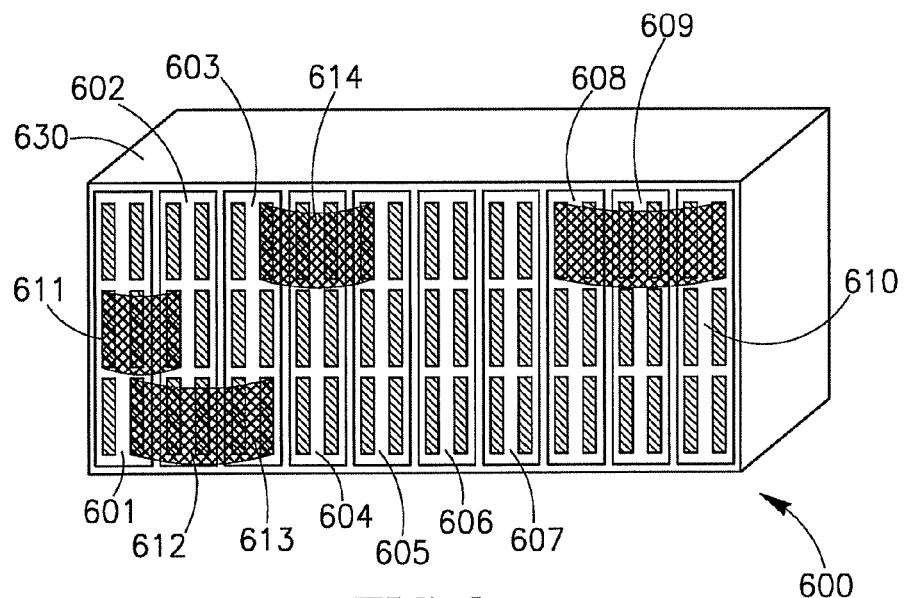
FIG. 6 is a schematic illustration of a three dimensional architecture of a system, in accordance with some demonstrative embodiments of the invention.

FIG. 6 schematically illustrates a three dimensional architecture of a system, in accordance with some embodiments of the invention. Connectivity between rigid boards may be flexible and fast. For example, system 600 may include ten rigid boards 601-610, located in the vicinity of one another, housed in a rack 630. In some embodiments, assembly of the rigid boards in a three-dimensional array results in a location of multiple connectors on every side, facing a single direction, thereby suitable to be comfortably connected. External bridges, for example, bridges 611-614, may externally connect connectors of different rigid boards, one with the other.

Figure 7:
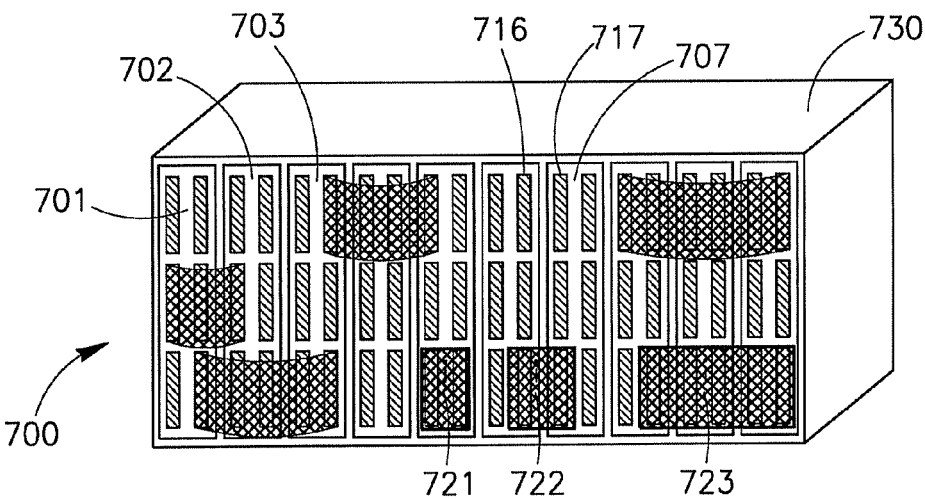
FIG. 7 is a schematic illustrates a three dimensional architecture of a system, in accordance with some demonstrative embodiments of the invention.

FIG. 7 schematically illustrates a three dimensional architecture of a system, in accordance with some embodiments of the invention. In some embodiments, a generally complete connection may be achieved, by connecting several segments, such that substantially every segment connects a part of the system. An overall system flexibility and connectivity, together with maximum speed performance, may be obtained using multiple connections between similar or dissimilar segments in multiple locations. System 700 may include ten rigid boards 701-710, located in a vicinity of one another, and housed in a rack 730. For example, generally every rigid board has two connectors on each of the three panels in every side. A connector represents connectivity to a specific component on the rigid board. For example, connectors 716 and 717 connect signals to specific components in rigid boards 706 and 707, respectively. Bridge 721 connects between two internal elements in rigid board 705, via an external connection. Bridge 722 connects between a component included in rigid board 706, and a component included in rigid board 707. Bridge 723 yields a bus connection, namely, a connection between physically remote rigid boards.

Figure 8:
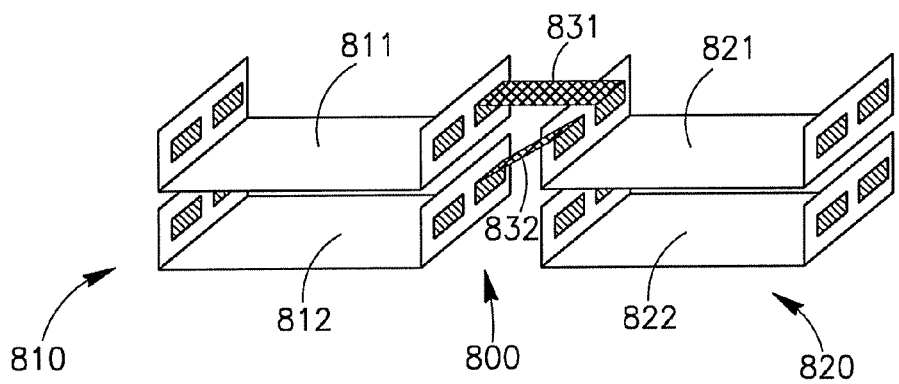
FIG. 8 is a schematic illustration of a system of rigid boards housed in multiple racks, in accordance with some demonstrative embodiments of the invention.

FIG. 8 schematically illustrates a system of rigid boards, housed in multiple racks, in accordance with some embodiments of the invention. In some embodiments, rigid boards and frames, or racks, may be connected side by side. In some embodiments, for example, the architecture shown in FIG. 8, may allow a simple connection between a first element in a first rigid board included in a first rack, and a second element in a second rigid board, included in a second rack, for example, when the rigid boards and/or racks are located side by side. For example, system 800 may include a first set of rigid boards belonging to a first rack 810, and a second set of rigid boards belonging to a second rack 820. For example, rigid board 821 of rack 820 may be connected to a first rigid board, 811, of rack 810, using an inter-rack connection bridge 831. Similarly, rigid board 821 of rack 820 may be additionally connected to a second rigid board 812 of rack 810, using an inter-rack connection bridge 832.

Figure 9:
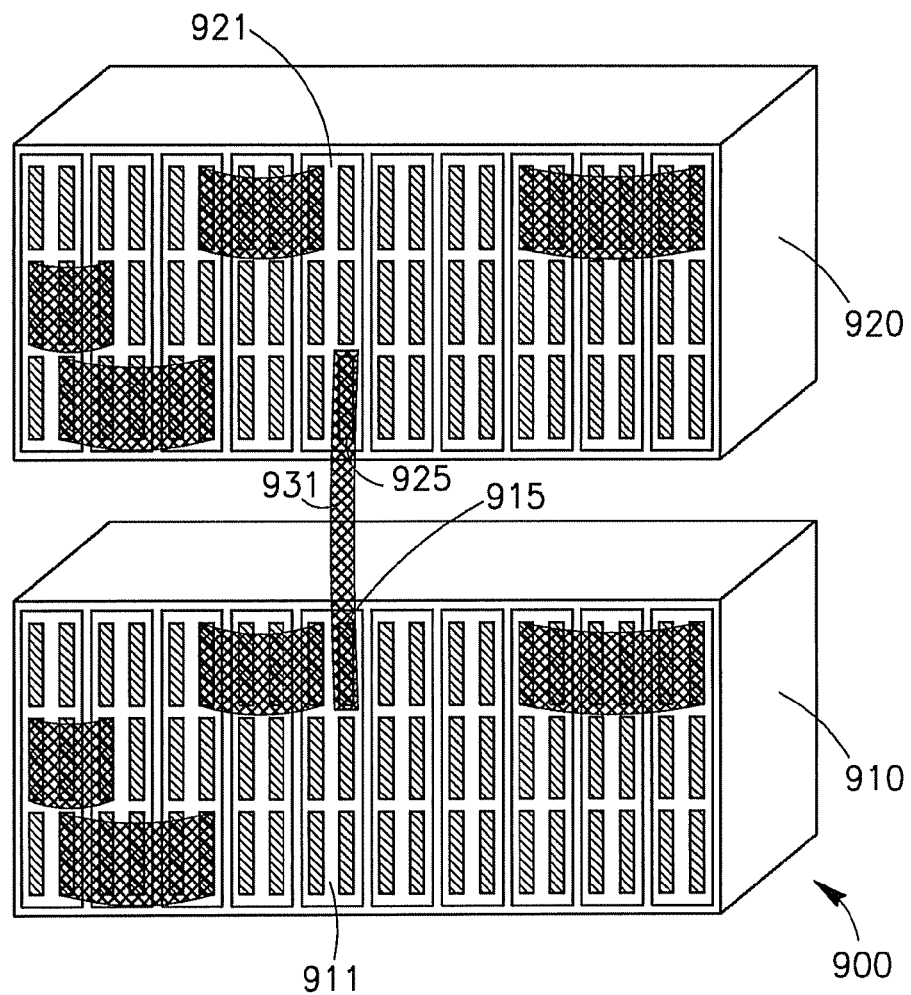
FIG. 9 is a schematic illustration a multi-rack system having first and second racks, the first rack located on top of the second rack, in accordance with some demonstrative embodiments of the invention.

FIG. 9 schematically illustrates a multi-rack system 100 having a first rack 910 and a second rack 920, the first rack 910 located on top of the second rack 920, in accordance with some demonstrative embodiments of the invention. As described herein, a three-dimensional architecture may allow connecting of two connectors, included in two separate racks, externally. For example, a connector 915 of rigid board 911 of rack 910, and a connector 925 of rigid board 921 of rack 920, may be connected using a connection bridge 931. Additional connections are shown.

Figure 10:
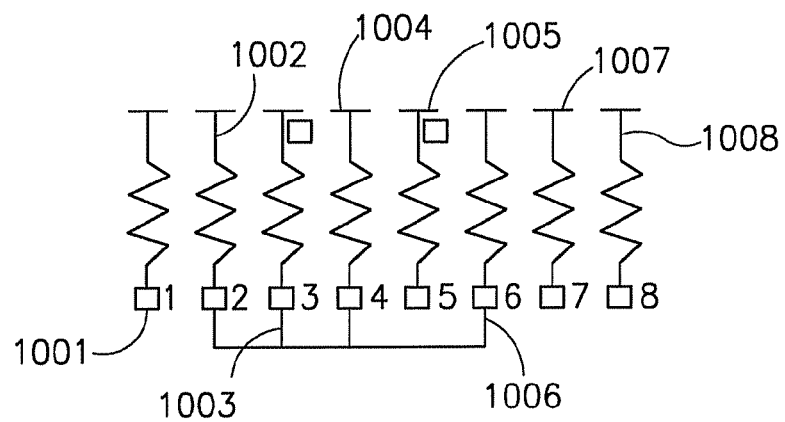
FIG. 10 is a schematic illustration of a set of identification pins, in accordance with some demonstrative embodiments of the invention.

FIG. 10 schematically illustrates a set of identification pins, in accordance with some demonstrative embodiments of the invention. In some embodiments, for example, a connection unit yields a connection between a connector on one rigid board with an additional connector on the same rigid board or on a different rigid board. In some embodiments, for example, a connector has a dedicated pin for identification purposes. A connection between two connectors connects corresponding identification pins. A dedicated identification pin of a connector is connected to a pull-up on the rigid board to which the connector is associated. Connectivity identification may include connecting a logical value, for example, a "0", to a specific dedicated pin. The identification may include, for example, scanning dedicated pins associated with other connectors and listing connectors, that have pin input of logical "0", as connected to the specific dedicated pin. The identification may include repeating the procedure with other dedicated pins, one by one, to have all connection lists. For example, connectors 1002-1004 and 1006 are connected together. When assigning a "0" value to connector 1002, connectors 1002, 1003, 1004 and 1006 will read a "0" value and all the other slots will read a "1" value. Thereby, a connection between connectors 1002-1004 and 1006 may be detected. Similarly, when assigning a "0" value to connector 1001, connectors 1002, 1003, 1004 and 1006 show an associated "1" value, thereby showing that they are not connected to connector 1001.

In other embodiments, for example, a similar identification method may be used, without dedicated pins for identification. In the identification, one or more nominal pins may be used in double function. For example, during the system identification test, the nominal pin is used as a connectivity identifier, whereas during operation of a system, the nominal pin is used as a regular pin. In other embodiments, for example, identification pins may provide identification and/or setup protocols allowing to add various types of logic. This may provide a solution to complex hardware problems for building, IC/SoC/ASIC development equipment, for example, verification systems, emulators and prototyping environment.

Some embodiments may include a significant amount of connections, allowed by having as many levels of connectors as required, in every side of the rigid board, connected as described herein.

In some embodiments, in which a system is utilized, for example, for design verification of IC/Soc/ASIC, the system may allow to include a considerable amount of electronic components as well as a considerable amount of flexible connectors. Some embodiments of the invention may allow a cooling of the system, maintainability, upgradeability and/or other features. In some embodiments, in which electronic components on the rigid boards (for example, FPGAs) are required to be connected, a fast on-board connection between the FPGAs may be utilized, regardless of the location thereof, for example, including in a case in which connected FPGAs are embedded on multiple rigid boards included in multiple racks. In some embodiments, a direct connection between generally every pair or group of FPGAs or other logic devices may be utilized.

Figure 11:
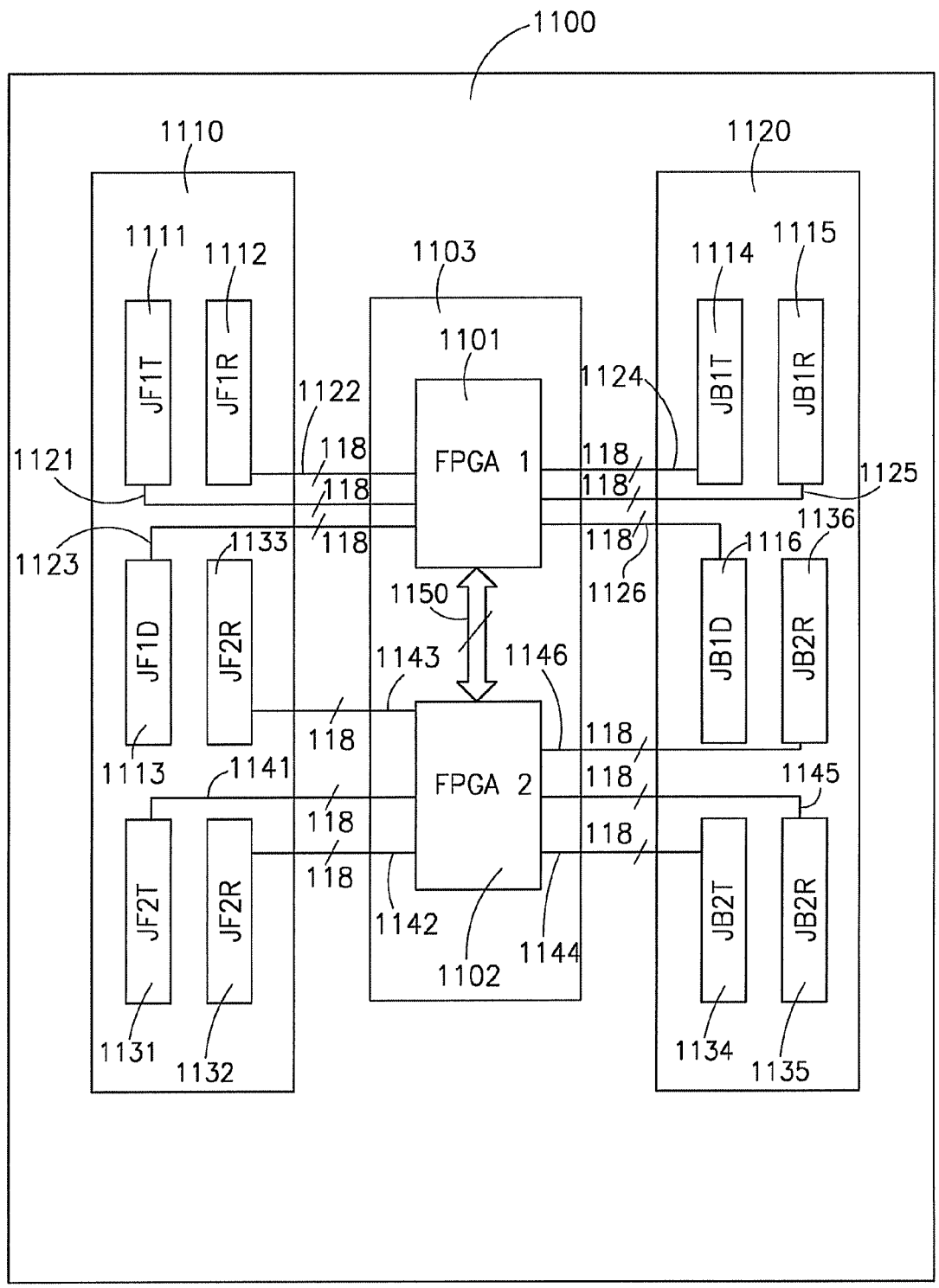
FIG. 11 is a schematic block diagram illustration of a FPGA tray, in accordance with some embodiments of the invention.

FIG. 11 schematically illustrates a block diagram of a FPGA tray, in accordance with some embodiments of the invention. In some embodiments, a FPGA tray 1100 may include two FPGA units 1101 (FPGA 1) and 1102 (FPGA2), soldered together, or otherwise embedded, on a rigid board 1103, connected using a connection 1150. Connection 1150 may include, for example, one or more wires, two wires, one or more dozens of wires, one or more hundreds of wires, one or more thousands of wires, approximately 260 wires or the like. In some embodiments, optionally, connection 1150 may not be included in the FPGA tray 1100, or may include substantially no wires, such that FPGA units 1101 and 1102 are not inter-connected. FPGA tray 1100 may include a front panel 1110 and a back panel 1120. In some embodiments, front panel 1110 and back panel 1120, may include connectors 1111-1116 and 1121-1126, respectively. In FIG. 11, the letter "J" in a label of a connector represents the word "jack", or socket, or the like. The letter "F" in a label of a connector represents the word "front", indicating that the labeled connector is located in front panel 1110. The letter "B" in a label of a connector represents the word "back", indicating that the labeled connector is located in back panel 1120. The digit "1" in a label of a connector, indicates that the labeled connector is associated with unit 1101. The digit "2" in a label of a connector, indicates that the labeled connector is associated with unit 1102. The letter "D" in a label of a connector represents the term Double Data Rate (DDR), indicating that the labeled connector is associated with a memory of units 1101 or 1102. The letter "T" in a label of a connector represents the word "transmitter", indicating that the labeled connector is associated with a transmission of data from units 1101 or 1102. The letter "R" in a label of a connector represents the word "receiver", indicating that the labeled connector is associated with a receiving of data to units 1101 or 1102.

In some embodiments, unit 1101 may be connected to connectors 1111-1116, using external connections 1121-1126, respectively. A connection from connections 1121-1126 may include, for example, approximately 118 wires, or approximately 120 wires, or the like. Similarly, unit 1102 may be connected to connectors 1131-1136, using external connections 1141-1146, respectively. A connection from connections 1141-1126 may include, for example, approximately 118 wires, or approximately 120 wires, or the like.

Some embodiments, for example, may allow interconnecting efficiently and rapidly a system including multiple FPGA trays (e.g., 3 trays, 10 trays, 30 trays, 50 trays, 100 trays, or the like), thereby including approximately 100 million equivalent ASIC gates, or more. In some embodiments, a system may be designed to operate at system clock speeds of up to 300 Megahertz or other suitable clock speeds or clock frequencies in accordance with available technology. In some embodiments, a rapid locating of bugs in a system may be allowed.

Some embodiments may utilize a scalable capacity within each system, varying from 5 million to 30 million equivalent ASIC gates.

Some embodiments may utilize significant connection flexibility, for example, 974 user Inputs/Outputs (I/Os) per FPGA, of which 708 I/Os may be directly connected to substantially any other FPGA. In some embodiments, a system may utilize up to 14,160 high-speed user I/Os to connect the system to hardware of a user or other systems. In some embodiments, a system may include 4,720 DDR I/Os of 250 Megahertz, and/or 2,320 LVDS RX channels of 1 Gigahertz, and/or 2,320 LVDS TX channels of 1 Gigahertz, and/or 14,160 single-ended speed I/Os.

Some embodiments may utilize high-speed connectivity, for example, of 300 Megahertz for single ended lines, or of 250 Megahertz for DDR I/Os, or of one Gigahertz for Low Voltage Differential Signal (LVDS) channels.

Some embodiments may utilize an open infrastructure for user add-on logic and future technology. Some embodiments may utilize up to 1,280 Megabytes of DDR II memories. Some embodiments may utilize Multi-Volt I/Os, allowing selections of different protocols and I/O voltages, for example, voltages of 1.5 volts, or 1.8 volts, or 2.5 volts and/or 3.3 volts. Some embodiments may include a modular rack containing 10 slots (into which a FPGA tray may be inserted, and out of which the FPGA tray may be removed) for a scalable FPGA platform, as well as a set of bridges or connections, for I/O connections.

In some embodiments, LVDS RX and LVDS TX I/Os may be utilized as dual-purpose I/Os. Additionally, LVDS RX and LVDS TX I/Os may be used as single ended bidirectional signals.

Some embodiments may include a 64 Megabyte DDR II DRAM block for a FPGA. Some embodiments may include a Multi-Port controller, allowing a DDR II DRAM block to be accessed via multiple First-In-First-Outs (FIFOs), thereby allowing rapid ensuring, as well as wide and flexible data steaming. This enables fast pattern injection from a network host, as well as a significant depth of signal tracing. In some embodiments, a size of a system including, for example, 10 FPGA trays, may be approximately 61 centimeters of length, approximately 30 centimeters of width and approximately 55 centimeters of height. A system may include a slide-in-slide-out mechanism, for example, one or rails or wheels, allowing to slide-in and/or to slide-out an individual FPGA tray, e.g., into or out of a rack or a backplane of a system. Other suitable insertion or storage mechanisms may be used, for example, to allow FPGA trays to be inserted or placed, e.g., one on top of another, side by side, or the like.

Although portions of the description herein relate, for demonstrative purpose, to "first" and "second" FPGAs or programmable logic devices, embodiments of the invention may be used in conjunction with more than two FPGAs or programmable logic devices, and a "second" FPGA or programmable logic device may include "another" FPGA or programmable logic device. In some embodiments, a FPGA tray may include a single FPGA unit, and may not necessarily include two or more FPGA units.

While certain features of the invention have been illustrated and described herein, many modifications, substitutions, changes, and equivalents may occur to those skilled in the art. It is, therefore, to be understood that the appended claims are intended to cover all such modifications and changes.

What is claimed is:

1. A Printed Circuit Board (PCB) system comprising:
   a rigid platform supporting at least one programmable logic device;
   at least one rigid panel supporting a set of connectors;
   a connection logically connecting the programmable logic device to at least two of the set of connectors supported by the rigid panel, wherein the rigid panel is connected through the connection with the rigid platform at a non-straight angle;
   another rigid panel supporting another set of connectors; and
   another connection logically connecting the programmable logic device to at least one of the set of connectors supported by the other rigid panel,
   wherein a density of wires of the connection is greater than a density of wires entering at least one of the connectors.

2. The PCB system of claim 1, wherein at least one of the connectors comprises a mechanism to transform a plurality of wires of the connection into a socket connection.

3. The PCB system of claim 1, wherein the rigid panel is connected through the connection with the rigid platform at an angle of approximately 90 degrees.

4. The PCB system of claim 1, wherein the rigid panel is connected through the connection with the rigid platform at an angle generally different from 90 degrees.

5. The PCB system of claim 1, wherein the connection comprises at least a number of wires sufficient to logically connect the programmable logic device to the set of connectors.

6. The PCB system of claim 1, comprising:
   a bridge to directly interconnect between the set of connectors and another set of connectors associated with one or more programmable logic devices external to the rigid platform.

7. The PCB system of claim 1, wherein the connection comprises at least 600 wires per programmable logic device.

8. The PCB system of claim 1, wherein at least one of the one or more programmable logic devices comprises a Field Programmable Gate Array (FPGA).

9. The PCB system of claim 1, comprising at least one more programmable logic device supported by the rigid platform.

10. The PCB system of claim 9, wherein at least two of the programmable logic devices supported by the rigid platform are interconnected.

11. The PCB system of claim 10, wherein at least two of the programmable logic devices supported by the rigid platform are interconnected using an interconnection comprising between 199 and 401 wires.

12. The PCB system of claim 1, wherein the connection comprises:
- at least one set of two differential wires capable of operating in transmission-only mode; and
- at least one other set of two differential wires capable of operating in reception-only mode.

13. The PCB system of claim 1, wherein at least one of the connectors comprises a non-right-angle connector.

14. A Printed Circuit Board (PCB) system comprising:
- a rigid platform supporting at least one programmable logic device;
- at least one rigid panel supporting a set of connectors; and
- a connection logically connecting the programmable logic device to at least two of the set of connectors supported by the rigid panel, wherein the rigid panel is connected through the connection with the rigid platform at a non-straight angle,
- wherein the PCB system includes at least one more programmable logic device supported by the rigid platform,
- wherein at least two of the programmable logic devices supported by the rigid platform are interconnected,
- wherein a density of wires of the connection is greater than a density of wires entering at least one of the connectors, and
- wherein one or more connectors of the set of connectors are directly connected to a component of a first of the programmable logic devices, and wherein one or more other connectors of the set of connectors are directly connected to a component of a second of the programmable logic devices.

15. A system for Printed Circuit Board (PCB) units, the system comprising:
- a rack capable of storing a set of PCB units,
- the rack comprising: a set of cavities to store the set of PCB units, and one or more PCB unit insertion mechanisms;
- wherein at least one PCB unit of the PCB units comprises:
  - a rigid platform supporting at least one programmable logic device;
  - at least one rigid panel supporting a set of connectors;
  - a connection logically connecting the programmable logic device to at least two of the set of connectors supported by the rigid panel, wherein the rigid panel is connected through the connection with the rigid platform at a non-straight angle;
- another rigid panel supporting another set of connectors; and
- another connection logically connecting the programmable logic device to at least one of the set of connectors supported by the other rigid panel,
- wherein a density of wires of the connection is greater than a density of wires entering at least one of the connectors.

16. The system of claim 15, wherein at least one of the insertion mechanisms comprises a slide-in/slide-out mechanism.

17. The system of claim 15, wherein at least one of the insertion mechanisms comprises one or more rails.

18. The system of claim 15, wherein at least one of the insertion mechanisms comprises one or more slots, and wherein a PCB unit is insertable into the one or more slots.

19. The system of claim 15, wherein the rack comprises a housing comprising:
- a first horizontal surface;
- a second horizontal surface generally parallel to the first horizontal surface;
- a first vertical surface; and
- a second vertical surface generally parallel to the first vertical surface;
- wherein the rigid panel is at an angle of approximately 90 degrees with the first horizontal surface, and
- wherein the rigid panel is at an angle of approximately 90 degrees with the first vertical surface.

20. The system of claim 15, comprising:
- another rack capable of storing another set of PCB units,
- wherein the racks are interconnected using one or more connections.

21. The system of claim 20, comprising a connection capable of physically connecting between: a programmable logic device of any of the PCB units of a first rack of the racks, and a programmable logic device of any one of the PCB units of a second rack of the racks.

22. The PCB system of claim 1, wherein the connection comprises a flexible connection flexibly connecting between the rigid platform and the rigid panel.

23. The system of claim 15, wherein the connection comprises a flexible connection flexibly connecting between the rigid platform and the rigid panel.

* * * * *